(12) United States Patent
Keite-Telgenbüscher et al.

(10) Patent No.: US 8,771,459 B2
(45) Date of Patent: Jul. 8, 2014

(54) METHOD OF ENCAPSULATING AN ELECTRONIC ARRANGEMENT

(75) Inventors: Klaus Keite-Telgenbüscher, Hamburg (DE); Jan Ellinger, Hamburg (DE); Thortsten Krawinkel, Hamburg (DE); Alexander Steen, Bonn (DE)

(73) Assignee: tesa SE, Hamburg (DE)

( * ) Notice: Subject to any disclaimer, the term of this patent is extended or adjusted under 35 U.S.C. 154(b) by 802 days.

(21) Appl. No.: 12/774,788

(22) Filed: May 6, 2010

(65) Prior Publication Data
US 2011/0036623 A1   Feb. 17, 2011

(30) Foreign Application Priority Data
Aug. 12, 2009   (DE) .......................... 10 2009 036 970

(51) Int. Cl.
*B29C 65/40*   (2006.01)
*H05K 1/16*   (2006.01)

(52) U.S. Cl.
USPC ........................... 156/325; 156/246; 174/260

(58) Field of Classification Search
USPC ........................... 174/260; 156/246, 325, 330
See application file for complete search history.

(56) References Cited

U.S. PATENT DOCUMENTS

| | | | |
|---|---|---|---|
| 4,051,195 A | 9/1977 | McWhorter | |
| 4,552,604 A | 11/1985 | Green | |
| 4,633,032 A | 12/1986 | Oido et al. | |
| 5,488,266 A | 1/1996 | Aoki et al. | |
| 2004/0216778 A1 | 11/2004 | Ferri | |
| 2004/0225025 A1 | 11/2004 | Sullivan | |
| 2005/0227082 A1 | 10/2005 | Shimazu | |
| 2006/0100299 A1 * | 5/2006 | Malik et al. | 522/31 |
| 2010/0012271 A1 * | 1/2010 | Krawinkel | 156/330 |

FOREIGN PATENT DOCUMENTS

| | | |
|---|---|---|
| DE | 10 2004 031 188 A1 | 1/2006 |
| DE | 10 2004 031 189 A1 | 1/2006 |
| DE | 10 2006 047 738 A1 | 4/2008 |
| DE | 102006047738 A1 * | 4/2008 |
| DE | 10 2008 047 964 A1 | 3/2010 |
| EP | 1 857 515 B1 | 3/2010 |
| JP | 2002260847 A | 9/2002 |
| JP | 2005298703 A | 10/2005 |
| JP | 2007297503 A | 11/2007 |
| JP | 2008004561 A | 1/2008 |
| JP | 2009127031 A | 6/2009 |
| JP | 2009149829 A | 7/2009 |
| WO | 98/21287 A1 | 5/1998 |
| WO | 03/002684 A1 | 1/2003 |
| WO | 03/065470 A1 | 8/2003 |
| WO | 2006/107748 A1 | 10/2006 |
| WO | 2007/087281 A1 | 8/2007 |
| WO | 2007/111607 A1 | 10/2007 |
| WO | 2008/036707 A2 | 3/2008 |
| WO | 2009/085736 A2 | 7/2009 |

OTHER PUBLICATIONS

German Search Report dated Apr. 15, 2010.

\* cited by examiner

*Primary Examiner* — Michael Orlando
*Assistant Examiner* — Daniel Lee
(74) *Attorney, Agent, or Firm* — Norris McLaughlin & Marcus PA

(57) ABSTRACT

The present invention relates to as method of encapsulating an electronic arrangement with respect to permeants, in which an at least partly crosslinked hotmelt adhesive based on acid-modified or acid-anhydride-modified vinylaromatic block copolymers is provided and in which the pressure-sensitive adhesive is applied to and/or around the regions of the electronic arrangement that are to be encapsulated.

21 Claims, 2 Drawing Sheets

METHOD OF ENCAPSULATING AN ELECTRONIC ARRANGEMENT

Figure 1:
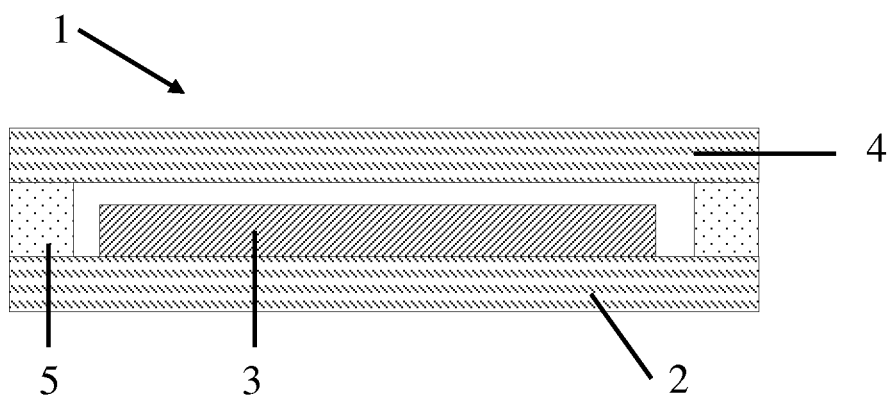

The present invention relates to a method of encapsulating an electronic arrangement in accordance with the preamble of Claim 1, and also to the use of a pressure-sensitive adhesive for encapsulating an electronic arrangement, in accordance with the preamble of Claim 5.

(Opto)electronic arrangements are being used with ever-increasing frequency in commercial products or are close to market introduction. Such arrangements comprise organic or inorganic electronic structures, examples being organic, organometallic or polymeric semiconductors or else combinations of these. Depending on the desired application, these arrangements and products are rigid or flexible in form, there being an increasing demand for flexible arrangements. Arrangements of this kind are produced, for example, by printing techniques, such as relief, gravure, screen or planographic printing, or else what is called "non-impact printing", such as, for instance, thermal transfer printing, inkjet printing or digital printing. In many cases, however, vacuum techniques are used as well, such as chemical vapour deposition (CVD), physical vapour deposition (PVD), plasma-enhanced chemical or physical deposition techniques (PECVD), sputtering, (plasma) etching or vapour coating, with patterning taking place generally through masks.

Examples of (opto)electronic applications that are already commercial or are of interest in terms of their market potential include electrophoretic or electrochromic constructions or displays, organic or polymeric light-emitting diodes (OLEDs or PLEDs) in readout and display devices, or as illumination, electroluminescent lamps, light-emitting electrochemical cells (LEECs), organic solar cells, preferably dye or polymer solar cells, inorganic solar cells, preferably thin-film solar cells, more particularly those based on silicon, germanium, copper, indium and selenium, organic field-effect transistors, organic switching elements, organic optical amplifiers, organic laser diodes, organic or inorganic sensors or else organic- or inorganic-based RFID transponders.

A perceived technical challenge for realization of sufficient lifetime and function of (opto)electronic arrangements in the area of organic and/or inorganic (opto)electronics, but especially in the area of organic (opto)electronics, is the protection of the components they contain against permeants. Permeants may be a large number of low molecular mass organic or inorganic compounds, more particularly water vapour and oxygen.

A large number of (opto)electronic arrangements in the area of organic and/or inorganic (opto)electronics, especially where organic raw materials are used, are sensitive not only to water vapour but also to oxygen, and for many arrangements the penetration of water or water vapour is classed as a relatively severe problem. During the lifetime of the electronic arrangement, therefore, it requires protection by means of encapsulation, since otherwise the performance drops off over the period of application. For example, oxidation of the components, in the case of light-emitting arrangements such as electroluminescent lamps (EL lamps) or organic light-emitting diodes (OLEDs) for instance, may drastically reduce the luminosity, the contrast in the case of electrophoretic displays (EP displays), or the efficiency in the case of solar cells, within a very short time.

In organic and/or inorganic (opto)electronics, particularly in the case of organic (opto)electronics, there is a particular need for flexible bonding solutions which constitute a permeation barrier to permeants, such as oxygen and/or water vapour. In addition there are a host of further requirements for such (opto)electronic arrangements. The flexible bonding solutions are therefore intended not only to achieve effective adhesion between two substrates, but also, in addition, to fulfil properties such as high shear strength and peel strength, chemical stability, ageing resistance, high transparency, ease of processing, and also high flexibility and pliability.

One approach common in the prior art, therefore, is to place the electronic arrangement between two substrates that are impermeable to water vapour and oxygen. This is then followed by sealing at the edges. For non-flexible constructions, glass or metal substrates are used, which offer a high permeation barrier but are very susceptible to mechanical loads. Furthermore, these substrates give rise to a relatively high thickness of the arrangement as a whole. In the case of metal substrates, moreover, there is no transparency. For flexible arrangements, in contrast, planar substrates are used, such as transparent or non-transparent films, which may have a multi-ply configuration. In this case is it possible to use not only combinations of different polymers, but also organic or inorganic layers. The use of such planar substrates allows a flexible, extremely thin construction. For the different applications there are a very wide variety of possible substrates, such as films, wovens, nonwovens and papers or combinations thereof, for example.

In order to obtain the most effective sealing, specific barrier adhesives are used. A good adhesive for the sealing of (opto)electronic components has a low permeability for oxygen and particularly for water vapour, has sufficient adhesion to the arrangement, and is able to flow well onto the arrangement. Low adhesion to the arrangement reduces the barrier effect at the interface, so permitting the ingress of oxygen and water vapour independently of the properties of the adhesive. Only if the contact between adhesive and substrate is continuous are the properties of the adhesive the determining factor for the barrier effect of the adhesive.

For the purpose of characterizing the barrier effect it is usual to state the oxygen transmission rate OTR and the water vapour transmission rate WVTR. Each of these rates indicates the flow of oxygen or water vapour, respectively, through a film per unit area and unit time, under specific conditions of temperature and partial pressure and also, optionally, further measurement conditions such as relative atmospheric humidity. The lower the values the more suitable the respective material for encapsulation. The statement of the permeation is not based solely on the values of WVTR or OTR, but instead also always includes an indication of the average path length of the permeation, such as the thickness of the material, for example, or a standardization to a particular path length.

The permeability P is a measure of the perviousness of a body for gases and/or liquids. A low P values denotes a good barrier effect. The permeability P is a specific value for a defined material and a defined permeant under steady-state conditions and with defined permeation path length, partial pressure and temperature. The permeability P is the product of diffusion term D and solubility term S $P=D*S$ The solubility term S describes in the present case the affinity of the barrier adhesive for the permeant. In the case of water vapour, for example, a low value for S is achieved by hydrophobic materials. The diffusion term D is a measure of the mobility of the permeant in the barrier material, and is directly dependent on properties, such as the molecular mobility or the free volume. Often, in the case of highly crosslinked or highly crystalline materials, relatively low values are obtained for D. Highly crystalline materials, however, are generally less transparent, and greater crosslinking results in a lower flexibility. The permeability P typically rises with an increase in the molecular mobility, as for instance when the temperature is raised or the glass transition point is exceeded.

Approaches at increasing the barrier effect of an adhesive must take particular account of the two parameters D and S, with a view to their influence on the permeability of water vapour and oxygen. In addition to these chemical properties, thought must also be given to consequences of physical effects on the permeability, particularly the average permeation path length and interface properties (flow-on behaviour of the adhesive, adhesion). The ideal barrier adhesive has low D values and S values in conjunction with very good adhesion to the substrate.

A low solubility term S is usually insufficient for achieving good barrier properties. One classic example of this, in particular, are siloxane elastomers. The materials are extraordinarily hydrophobic (low solubility term), but as a result of their freely rotatable Si—O bond (large diffusion term) have a comparatively low barrier effect for water vapour and oxygen. For a good barrier effect, then, a good balance between solubility term S and diffusion term D is necessary.

For this purpose use has hitherto been made in particular of liquid adhesives and adhesives based on epoxides (WO 98/21287 A1; U.S. Pat. No. 4,051,195 A; U.S. Pat. No. 4,552, 604 A). As a result of a high degree of crosslinking, these adhesives have a low diffusion term D. Their principal field of use is in the edge bonding of rigid arrangements, but also moderately flexible arrangements. Curing takes place thermally or by means of UV radiation. Full-area bonding is hard to achieve, owing to the contraction that occurs as a result of curing, since in the course of curing there are stresses between adhesive and substrate that may in turn lead to delamination.

Using these liquid adhesives harbours a series of disadvantages. For instance, low molecular mass constituents (VOCs—volatile organic compounds) may damage the sensitive electronic structures in the arrangement and may hinder production operations. The adhesive must be applied, laboriously, to each individual constituent of the arrangement. The acquisition of expensive dispensers and fixing devices is necessary in order to ensure precise positioning. Moreover, the nature of application prevents a rapid continuous operation, and the laminating step that is subsequently needed may also make it more difficult, owing to the low viscosity, to achieve a defined layer thickness and bond width within narrow limits.

Furthermore, the residual flexibility of such highly crosslinked adhesives after curing is low. In the low temperature range or in the case of 2-component systems, the use of thermally crosslinking systems is limited by the potlife, in other words the processing life until gelling has taken place. In the high temperature range, and particularly in the case of long reaction times, in turn, the sensitive (opto) electronic structures limit the possibility of using such systems—the maximum temperatures that can be employed in the case of (opto)electronic structures are often 90° C., since above even this temperature there may be initial damage. Flexible arrangements which comprise organic electronics and are encapsulated using transparent polymer films or assemblies of polymer films and inorganic layers, in particular, have narrow limits here. The same applies to laminating steps under high pressure. In order to achieve improved durability, it is advantageous here to forego a high temperature loaded step and to carry out lamination under a relatively low pressure.

As an alternative to the thermally curable liquid adhesives, radiation-curing adhesives are now used in many cases (US 2004/0225025 A1). The use of radiation-curing adhesives prevents long-lasting thermal load on the electronic arrangement. As a result of the irradiation, however, there is short-term pointwise heating of the arrangement, since, in general, there is not only UV radiation emitted but also a very high fraction of IR radiation. Other aforementioned disadvantages of liquid adhesives, such as VOC, contraction, delamination and low flexibility, are likewise retained. Problems may come about as a result of additional volatile constituents or elimination products from the photoinitiators or sensitizers. Moreover, the arrangement must be transparent to UV light.

Other radiation-curing liquid adhesives on an elastomeric basis are disclosed in the following publications:

A radiation-curing adhesive on a different chemical basis, principally acrylates and acrylate-modified elastomers, for optoelectronic components, is described in WO 2006/107748, where water absorbers are added for the purpose of improving the water vapour barrier.

Another radiation-curing adhesive on a similar chemical basis, more particularly with acrylate-modified polyisobutylenes, is described in WO 2007/111607.

Although this reduces the disadvantage of the low flexibility, all of the other aforementioned disadvantages of reactive liquid adhesives continue to exist.

Since constituents especially of organic electronics, and many of the polymers employed, are frequently sensitive to UV exposure, a long-lasting outdoor use is not possible without further, additional protective measures, such as further outer films, for instance. In the case of UV-curing adhesive systems, these films can be applied only after UV curing, whereby additionally increasing the complexity of the manufacture and the thickness of the arrangement.

Also known for encapsulating electronic arrangements are pressure-sensitive adhesive tapes (e.g. US 2006/0100299 A1, WO 2007/087281 A1, US 2005/0227082, DE 102008047964, DE 102008060113).

US 2006/0100299 A1 discloses a UV-curable pressure-sensitive adhesive tape for encapsulating an electronic arrangement. The pressure-sensitive adhesive tape comprises an adhesive based on a combination of a polymer having a softening point of more than 60° C., a polymerizable epoxy resin having a softening point of below 30° C., and a photoinitiator. The polymers may be polyurethane, polyisobutylene, polyacrylonitrile, polyvinylidene chloride, poly(meth) acrylate or polyesters, but more particularly may be acrylate. Also present are tackifier resins, plasticizers or fillers.

Acrylate compositions have very good resistance to UV radiation and various chemicals, but possess very different bond strengths to different substrates. Whereas on polar substrates such as glass or metal the bond strength is very high, the bond strength on apolar substrates, such as polyethylene or polypropylene, for example, tends to be low. Here there is a particular risk of diffusion at the interface. Moreover, these compositions are highly polar, which promotes diffusion, particularly of water vapour, in spite of subsequent crosslinking. This tendency is increased further through the use of polymerizable epoxy resins.

The pressure-sensitive adhesive embodiment specified in US 2006/0100299 has the advantage of simplicity of application, but likewise suffers from possible elimination products as a result of the photoinitiators present, from an inevitable UV transparency of the construction, and from a reduction in flexibility after curing. Moreover, as a result of the low fraction of epoxy resins or other crosslinkers that is necessary to maintain the pressure-sensitive adhesion, and more particularly the cohesion, the crosslinking density achievable is very much lower than with liquid adhesives.

WO 2007/087281 A1 discloses a transparent flexible pressure-sensitive adhesive tape based on polyisobutylene (PIB)

for electronic applications, especially OLEDs. It uses polyisobutylene having a molecular weight of more than 500 000 g/mol and a hydrogenated cyclic resin. An optional possibility is the use of a photopolymerizable resin and a photoinitiator.

The low polarity of adhesives based on polyisobutylene gives them a good barrier to water vapour, but even at high molecular weights they have a relatively low cohesiveness, and so at elevated temperatures frequently exhibit a low shear strength. The fraction of low molecular mass constituents cannot be reduced ad infinitum, since otherwise the adhesion is significantly lowered and there is an increase in the interface permeation. When a high fraction of functional resins is used, which is necessary on account of the very low cohesion of the composition, the polarity of the composition goes up again and hence the solubility term is increased.

Also described are barrier adhesives based on styrene block copolymers, as far as possible hydrogenated and correspondingly hydrogenated resins, DE 102008047964. As a result of the formation of at least two domains within the block copolymer, very good cohesion at room temperature and, at the same time, improved barrier properties are additionally obtained.

In contrast to liquid adhesives, as a result of the relatively high molecular mass polymers, pressure-sensitive adhesive tapes generally require, for effective wetting and adhesion on the surface, a certain time, sufficient pressure and a good balance between viscous component and elastic component. Moreover, pressure-sensitive adhesives, especially those based on polyisobutylene but also those based on styrene block copolymers, display a significant disadvantage: in the case of an adhesive bond between two films which have been provided with a barrier layer, an example being two PET films having an SiOx coating, the kind which can be used for organic solar cells, for example, there is severe bubbling in the course of storage under hot and humid conditions. Even prior drying of the films and/or adhesive is unable to prevent this bubbling.

Known from the prior art, furthermore, is a pressure-sensitive adhesive without barrier properties (WO 03/065470 A1), which is used as a transfer adhesive in an electronic construction. The adhesive comprises a functional filler which reacts with oxygen or water vapour within the construction. Consequently, simple application of a scavenger within the construction is possible. The construction is sealed with respect to the outside by using another adhesive with a low permeability.

Additionally known are hotmelt adhesives for the encapsulation of electronic constructions. In many cases, here, copolymers of ethylene are used, examples being ethylene-ethyl acetate (EEA), ethylene-acrylic acid copolymer (EAA), ethylene-butyl acrylate (EBA) or ethylene-methyl acrylate (EMA). Particularly for solar cell modules based on silicon wafers, it is usual to use crosslinking ethylene-vinyl acetate (EVA) copolymers. Crosslinking takes place in this case during the sealing operation under pressure and at temperatures above about 120° C. This operation is disadvantageous for many (opto)electronic constructions that are based on organic semiconductors or that are produced in thin-film processes, owing to the high temperatures or the mechanical load imposed by the pressure. In JP2002260847, however, this operation is also indicated for organic light-emitting diodes.

Other crosslinking or non-crosslinking hotmelt adhesives based on block copolymers or functionalized polymers are described in U.S. Pat. No. 5,488,266, WO 2008/036707 A2, WO 2003/002684, JP 2008004561, JP 2005298703 and US 20040216778.

Furthermore, in WO 2009/085736 A2, a hotmelt adhesive is described, for the edge sealing of solar cells, in which a desiccant is incorporated. The base polymer used is, for example, a polyisobutylene and a 1-butene copolymer. In certain embodiments, crosslinking polymers are used.

A WVTR of 3 $g/m^2*d$ is reported, but the thickness of the layer is not addressed. Moreover, the hotmelt adhesive is applied in liquid form and is processed at high temperatures of 160° C.

A similar approach is shown in U.S. Pat. No. 4,633,032. For the edge sealing of a solar module, a hotmelt butyl rubber—PIB for example—is used, but is not specified in any more detail.

Disadvantages of the hotmelt adhesives used in the prior art are that, in the absence of crosslinking, the barrier effect is low, particularly the barrier against oxygen, and also that the cohesion of the adhesive drops off sharply at higher temperatures. As a result, the risk of bubbling on storage of the construction under hot and humid conditions is increased. If the adhesive is crosslinked thermally, then temperatures are usually necessary which harbour the risk of damage to the electronic construction. Radiation-crosslinking hotmelt adhesives, in turn, harbour the disadvantage of the possible radiation damaging of the electronic construction, and of the need for radiation permeability in part of the construction.

Moreover, many of the hotmelt adhesives described do not take the form of a planar substrate which is easy to process, but instead must be applied in liquid form at high temperatures of more than 120° C.

It is an object of the present invention to specify a method of encapsulating an electronic arrangement with respect to permeants, especially water vapour and oxygen, that is simple to carry out and with which at the same time effective encapsulation is achieved, without bubbles being formed on bonding between two polyester films with a barrier layer and on storage at 85° C. and 85% rh. Furthermore, the lifetime of (opto)electronic arrangements is to be increased through the use of a suitable, especially flexible, adhesive.

The present invention solves the problem described above through a method according to Claim 1. Solutions of equal standing are described by Claims 5 and 24. Preferred embodiments and developments are subject matter of the respective dependent claims.

The main claim accordingly relates to a method of encapsulating an electronic arrangement with respect to permeants, in which an at least partly crosslinked hotmelt adhesive based on acid-modified or acid anhydride-modified vinylaromatic block copolymers is provided, and in which the hotmelt adhesive is applied to and/or around the regions of the electronic arrangement that are to be encapsulated.

Permeants in the sense of the present specification are those chemical substances (for example atoms, ions, molecules, etc.) which may penetrate into an arrangement or a component, more particularly an electronic or optoelectronic arrangement or a corresponding component, where they may in particular cause functional disruptions. This penetration may take place, for example, through the housing or through the encasement itself, but also, in particular, through openings in the housing or the encasement, or through seams, bonding points, welding points or the like. The housing or encasement in this sense is understood to refer to the components which wholly or partly surround the sensitive components and which, in addition to their mechanical function, are intended in particular to protect said sensitive components.

Permeants in the sense of the present specification are, in particular, low molecular mass organic or inorganic compounds, for example hydrogen ($H_2$), especially oxygen ($O_2$)

and water ($H_2O$). The permeants may in particular be in gas or vapour form. Reference is hereby made to the remarks in the introductory section.

The present invention is based initially on the surprising finding that even hotmelt adhesives which are crosslinked prior to application can still be processed by a heat sealing method and in that case develop sufficient adhesion to allow effective encapsulation of an electronic construction. It has been found, indeed, that an at least partly crosslinked hotmelt adhesive based on vinylaromatic block copolymers is particularly suitable for encapsulating electronic arrangements. In accordance with the invention, correspondingly, a hotmelt adhesive based on crosslinkable vinylaromatic block copolymers is prepared and, with heating, is applied to those regions of the electronic arrangement to be encapsulated. Depending on the embodiment of the hotmelt adhesive, there is no longer any need for subsequent treatment.

A hotmelt adhesive based on vinylaromatic block copolymers implies in particular a hotmelt adhesive in which the total fraction of the block copolymers is at least 40% by weight, preferably at least 55% by weight.

At least partial crosslinking means that at least some of the chemical groups available for crosslinking have also in fact undergone a crosslinking reaction.

Encapsulation in the present case refers not only to complete enclosure with the stated pressure-sensitive adhesive, but also even application of the hotmelt adhesive to some of the regions to be encapsulated in the (opto)electronic arrangement: for example, a single-sided coverage or the entraining of an electronic structure.

Through the selection of the constituents of the hotmelt adhesive and the consequent low polarity, resulting from an apolar block of the vinylaromatic block copolymer and from the resultant low solubility term (S) of the diffusion coefficient, a low permeants of permeants such as water vapour and oxygen is achieved, but particularly of water vapour. The formation of at least two domains within the block copolymer additionally produces very good cohesion and at the same time improved barrier properties. This formation of domains is often also referred to as "physical crosslinking", but for the present purposes is not counted under the term "crosslinking". By means of correspondingly chemically modified and/or further components, as described below, and in accordance with the requirements relating to the (opto)electronic arrangement, by means of a crosslinking reaction, the properties are advantageously adapted to the requirements, with at least some of the crosslinking taking place even before the application of the hotmelt adhesive.

Advantages of the present invention, then, in comparison to pressure-sensitive adhesives, are the combination of very good barrier properties with respect to oxygen and especially with respect to water vapour in conjunction with good interface adhesion on different substrates, good cohesive properties, even at temperatures above the softening range of the styrene domains, as a result of a crosslinking reaction which is described below, and, in comparison to liquid adhesives, a very high flexibility and ease of application in the (opto)electronic arrangement and at/in encapsulation. In comparison to other hotmelt adhesives, they are notable for a low application temperature in conjunction with the given temperature stability. Depending on the embodiment of the hotmelt adhesive, adhesives based on crosslinked vinylaromatic block copolymers afford good resistance to chemicals and environmental effects. In certain embodiments, furthermore, transparent adhesives are present which may find use in a particular way for application in (opto)electronic arrangements, since the reduction of incident or emergent light is kept very low.

Features of the hotmelt adhesive based on crosslinked vinylaromatic block copolymers, then, in addition to good processing and coating properties, include good product properties in respect of adhesion and cohesion and also a good barrier effect with respect to oxygen and a very good barrier effect with respect to water vapour, especially as compared with hotmelt adhesives based on acrylates, nitrile rubbers or chloroprene rubbers or ethylene-vinyl acetate copolymers. A hotmelt adhesive of this kind can be integrated simply into an electronic arrangement, more particularly into such an arrangement that requires high flexibility. Other particularly advantageous properties of the hotmelt adhesive are similarly good adhesion to different substrates, high shear strength and high flexibility. As a result of the very good adhesion to the substrate, moreover, the interface permeation achieved is low. Through the use of the formulations described herein for the encapsulation of (opto)electronic structures, advantageous arrangements are obtained which combine the advantages set out above, thereby accelerating and simplifying the encapsulating operation, and increasing product quality.

Because, in certain embodiments of the hotmelt adhesive, following application, there is no need for any other thermal operating steps or irradiation, there is no contraction as a result of a post-application crosslinking reaction when the (opto)electronic construction is being constructed, and the hotmelt adhesive is present as a material in web form or in a form adapted appropriately to the electronic arrangement, the composition can be integrated simply and quickly, at low pressure and low temperature, into the operation of encapsulating the (opto)electronic construction. The disadvantages usually associated with the processing steps avoided, such as thermal and mechanical loads, can thus be minimized. Encapsulation by lamination of at least parts of the (opto)electronic constructions with a planar barrier material (e.g. glass, especially thin glass, metal oxide-coated films, metallic foils, multilayer substrate materials) can be achieved with a very good barrier effect in a simple roll-to-roll process. The flexibility of the overall construction is dependent not only on the flexibility of the hotmelt adhesive but also on further factors, such as geometry and thickness of the (opto)electronic constructions and/or of the planar barrier materials. The high flexibility of the hotmelt adhesive, however, allows realization with very thin, pliable and flexible (opto)electronic constructions. The term "pliable" that is utilized refers to the capacity to conform without damage to the curvature of a curved article such as a drum having a defined radius, in particular having a radius of 1 mm.

Of particular advantage for the encapsulation of (opto) electronic constructions is the fact that the at least partly crosslinked hotmelt adhesive of the invention can be applied a low temperature. The temperature is advantageously less than 120° C. Temperatures between 80° C. and 100° C. have turned out to represent an optimum temperature range.

In a preferred embodiment of a method of encapsulating an electronic arrangement with respect to permeants, the hotmelt adhesive may be provided in the form of an adhesive tape. This form of presentation permits particularly simple and uniform application of the hotmelt adhesive.

The general expression "adhesive tape" encompasses in one embodiment a carrier material which is provided on one or both sides with a hotmelt adhesive. The carrier material encompasses all planar structures, examples being two-dimensionally extended films or film sections, tapes with an extended length and limited width, tape sections, diecuts, multi-layer arrangements, and the like. For different applications it is possible to combine a wide variety of different carriers, such as films, woven fabrics, nonwovens and papers, for example, with the adhesives. Furthermore, the expression "adhesive tape" also encompasses what are called "adhesive transfer tapes" or "heat-activable films", i.e. an adhesive tape without carrier. In the case of an adhesive transfer tape, the adhesive is instead applied prior to application between flexible liners which are provided with a release coat and/or have anti-adhesive properties. For application, generally, first one liner is removed, the adhesive is applied, and then the second liner is removed. In the case of a heat-activable film, even these liners are absent, or there is one liner on just one side. The hotmelt adhesive can thus be used directly to join two surfaces in (opto)electronic arrangements.

As the carrier material of an adhesive tape it is preferred in the present case to use polymer films, film composites, or films or film composites that have been provided with organic and/or inorganic layers. Such films/film composites may be composed of any common plastics used for film manufacture, examples—though without restriction—including the following:
polyethylene, polypropylene—especially the oriented polypropylene (OPP) produced by monoaxial or biaxial stretching, cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyethersulphone (PES) or polyimide (PI).

The carrier, moreover, may be combined with organic or inorganic coatings or layers. This can be done by customary techniques, such as surface coating, printing, vapour coating, sputtering, coextruding or laminating, for example. Examples—though without restriction—here include, for instance, oxides or nitrides of silicon and of aluminium, indium-tin oxide (ITO) or sol-gel coatings.

With particular preference these films/film composites, especially the polymer films, are provided with a permeation barrier for oxygen and water vapour, the permeation barrier exceeding the requirements for the packaging sector (WVTR<$10^{-1}$ g/(m$^2$d); OTR<$10^{-1}$ cm$^3$/(m$^2$d bar)). The permeability for oxygen (OTR) and water vapour (WVTR) is determined in accordance with DIN 53380 part 3 and ASTM F-1249, respectively. The oxygen permeability is measured at 23° C. and a relative humidity of 50%. The water vapour permeability is determined at 37.5° C. and a relative humidity of 90%. The results are standardized for a film thickness of 50 µm.

In a preferred embodiment, moreover, the films/film composites may be transparent in form, so that the overall construction of such an adhesive article is also transparent in form. "Transparency" here denotes an average transmittance in the visible region of light of at least 75%, preferably higher than 90%.

According to the requirements of the (opto)electronic arrangement, it is possible in one particular embodiment of the hotmelt adhesive for the elastic and viscous properties, and also the barrier effect, to be additionally varied by means of a subsequent crosslinking reaction. In a form adapted to the (opto)electronic arrangement, this may take place both thermally and by means of electromagnetic radiation, but preferably by means of UV radiation, electron radiation or gamma radiation. Hence it is possible for both the barrier effect and the adhesive strength to be increased following introduction into the (opto)electronic construction. At the same time, however, the high flexibility of the hotmelt adhesive is generally retained.

With further preference a hotmelt adhesive is employed which in certain embodiments is transparent in the visible light of the spectrum (wavelength range from about 400 nm-800 nm). For certain applications, for instance in the case of solar cells, however, this range may also be extended to defined UV or IR regions. The desired transparency in the preferred region of the visible spectrum can be achieved in particular through the use of colourless tackifier resins. A hotmelt adhesive of this kind is therefore also suitable for full-area use over an (opto)electronic structure. Full-area bonding, in the case of an approximately central disposition of the electronic structure, in contrast to edge sealing, offers the advantage that the permeant would have to diffuse through the entire area before reaching the structure. The permeation pathway is therefore significantly increased. The prolonged permeation pathways in this embodiment, in comparison to edge sealing by means of liquid adhesives, for instance, has positive consequences for the overall barrier, since the permeation pathway is in inverse proportion to the permeability.

"Transparency" here denotes an average transmittance of the adhesive in the visible range of light of at least 75%, preferably higher than 90%. In the case of the embodiment as a hotmelt adhesive tape with carrier, the maximum transmittance of the overall construction is dependent, moreover, on the nature of the carrier used and on the nature of the construction.

The electronic structures of (opto)electronic arrangements are often susceptible to UV radiation. It has turned out here to be particularly advantageous if the hotmelt adhesive is additionally of UV-blocking design. The term "UV-blocking" refers in the present instance to an average transmittance of not more than 20%, preferably of not more than 10%, more preferably of not more than 1%, in the corresponding wavelength range. In a preferred embodiment the hotmelt adhesive is of UV-blocking design in the wavelength range from 320 nm to 400 nm (UVA radiation), preferably in the wavelength range from 280 nm to 400 nm (UVA and UVB radiation), more preferably in the wavelength range from 190 nm to 400 nm (UVA, UVB and UVC radiation).

The UV-blocking effect of the hotmelt adhesive may be achieved in particular through the addition of UV blockers or suitable fillers to the hotmelt adhesive. Examples of suitable UV blockers include HALS (Hindered Amine Light Stabilizers) such as Tinuvin from Ciba or benzimidazole derivatives. A particularly suitable filler is titanium dioxide, especially nanoscale titanium dioxide, since this allows transparency in the visible range to be retained.

In another advantageous embodiment the hotmelt adhesive exhibits very good resistance to weathering effects and UV light. This resistance may be obtained in particular through use of hydrogenated elastomers and/or hydrogenated resins.

Adhesives used are preferably those based on block copolymers comprising polymer blocks predominantly formed of vinylaromatics (A blocks), preferably styrene, and those predominantly formed by polymerization of 1,3-dienes (B blocks), preferably butadiene, isoprene or a mixture of both isomers. These B blocks typically have a low polarity. Both homopolymer and copolymer blocks can be utilized with preference as B blocks.

The block copolymers resulting from the A and B blocks may comprise the same or different B blocks, which may have been partly, selectively or fully hydrogenated. The block copolymers may have linear A-B-A structures. It is likewise possible to employ block copolymers of radial architecture, and also star-shaped and linear multiblock copolymers. Further components present may include A-B diblock copolymers. Block copolymers of vinylaromatics and isobutylene are likewise suitable for application in accordance with the invention. All of the aforementioned polymers may be utilized alone or in a mixture with one another.

It is also possible to use block copolymers which in addition to the above-described blocks A and B comprise at least one further block, such as A-B-C block copolymers.

Also conceivable, though not a subject of the present invention, is the use of the abovementioned B blocks with A blocks of different chemical nature, which have a glass transition temperature above room temperature, such as polymethyl methacrylate, for example.

In one advantageous embodiment the block copolymers have a polyvinylaromatic fraction of 10% to 35% by weight.

In another preferred embodiment the fraction of the vinylaromatic block copolymers in total, based on the overall hotmelt adhesive, is at least 50%, preferably at least 70% and more preferably at least 80% by weight. A result of an inadequate fraction of vinylaromatic block copolymers is that the cohesion of the hotmelt adhesive is relatively low or the adhesive becomes tacky. The maximum fraction of the vinylaromatic block copolymers in total, based on the overall hotmelt adhesive, is not more than 100% by weight.

At least some of the block copolymers used are acid-modified or acid anhydride-modified, the modification being accomplished principally by means of free-radical graft copolymerization of unsaturated monocarboxylic and polycarboxylic acids or anhydrides, such as fumaric acid, itaconic acid, citraconic acid, acrylic acid, maleic anhydride, itaconic anhydride or citraconic anhydride, preferably maleic anhydride. The fraction of acid or acid anhydride is preferably between 0.5 and 4 percent by weight, based on the overall block copolymer.

The crosslinking of these elastomers may take place in a variety of ways.

On the one hand, the acid or anhydride groups may be reacted with crosslinkers, such as various amines or epoxy resins.

Amines employed may be primary and secondary amines or else amides and other nitrogen-containing compounds with a hydrogen directly bound on the nitrogen.

Epoxy resins are usually taken to be both monomeric and oligomeric compounds having more than one epoxide group per molecule. They may be reaction products of glycidyl esters or epichlorohydrin with bisphenol A or bisphenol F or mixtures of these two. It is likewise possible to employ epoxy novolak resins obtained by reacting epichlorohydrin with the reaction product of phenols and formaldehyde. Monomeric compounds having two or more terminal epoxide groups, which are used as diluents for epoxy resins, can likewise be employed. It is likewise possible to employ elastically modified epoxy resins or epoxide-modified elastomers such as, for example, epoxidized styrene block copolymers, an example being Epofriend from Daicel.

Examples of epoxy resins are Araldite™ 6010, CY-281™, ECN™ 1273, ECN™ 1280, MY 720, RD-2 from Ciba Geigy, DER™ 331, 732, 736, DEN™ 432 from Dow Chemicals, Epon™ 812, 825, 826, 828, 830 etc. from Shell Chemicals, HPT™ 1071, 1079, likewise from Shell Chemicals, and Bakelite™ EPR 161, 166, 172, 191, 194 etc. from Bakelite AG.

Examples of commercial aliphatic epoxy resins are vinylcyclohexane dioxides such as ERL-4206, 4221, 4201, 4289 or 0400 from Union Carbide Corp.

Elastified elastomers are available from Noveon under the Hycar name.

Epoxide diluents, monomeric compounds having two or more epoxide groups, are, for example, Bakelite™ EPD KR, EPD Z8, EPD HD, EPD WF, etc. from Bakelite AG or Polypox™ R 9, R12, R 15, R 19, R 20 etc. from UCCP.

In these reactions an accelerant is typically used as well. This accelerant may come from the group, for example, of the tertiary amines or modified phosphines, such as triphenylphosphine, for example.

Whereas the reaction of the amines takes place frequently even at room temperature, the crosslinking of the epoxy resins generally proceeds at an elevated temperature.

The second possibility of crosslinking takes place via metal chelates. Crosslinking of maleic anhydride-modified block copolymers with metal chelates is known from EP 1311559 B1, where an increase in the cohesion of the block copolymer mixtures is described. There is no mention, however, of use in (opto)electronic constructions.

The metals of the metal chelates may be from main groups 2, 3, 4 or 5 or the transition metals. Particular suitability is possessed for example by aluminium, tin, titanium, zirconium, hafnium, vanadium, niobium, chromium, manganese, iron, cobalt, and cerium. Aluminium and titanium are particularly preferred.

For the chelate crosslinking it is possible for different metal chelates to be employed, which may be represented with the following formula:

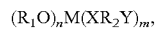

$$(R_1O)_n M(XR_2Y)_m,$$

where
M is a metal as described above;
$R_1$ is an alkyl or aryl group such as methyl, ethyl, butyl, isopropyl or benzyl;
n is zero or a larger integer,
X and Y are oxygen or nitrogen, and may in each case also be joined to $R^2$ by a double bond;
$R_2$ is an alkylene group which joins X and Y and may be branched, or else may comprise oxygen or other heteroatoms in the chain;
m is an integer, but is at least 1.

Preferred chelate ligands are those resulting from the reaction of the following compounds: triethanolamine, 2,4-pentanedione, 2-ethyl-1,3-hexanediol or lactic acid. Particularly preferred crosslinkers are aluminium acetylacetonates and titanyl acetylacetonates.

The ratio selected between the acid and/or acid anhydride groups and the acetylacetonate groups here ought to be approximately equivalent in order to achieve optimum crosslinking, and a small excess of crosslinker has proved to be positive. However, the ratio between anhydride groups and acetylacetonate groups can be varied, in which case, for sufficient crosslinking, neither of the two groups should be present in more than a five-fold molar excess.

Surprisingly, hotmelt adhesives comprising chelate-crosslinked, acid or acid anhydride-modified vinylaromatic block copolymers also exhibit very low water vapour and oxygen permeability. This is unexpected of a hotmelt adhesive having such polar constituents as acid anhydrides and metal chelates.

In a further-preferred embodiment the hotmelt adhesive, in addition to the at least one vinylaromatic block copolymer, comprises at least one tackifier resin in order to increase the adhesion in a desired way. The tackifier resin ought to be compatible with the elastomer block of the block copolymers.

As tackifiers in the hotmelt adhesive it is possible to use, for example, unhydrogenated, partially hydrogenated or fully hydrogenated resins based on rosin and rosin derivatives, hydrogenated polymers of dicyclopentadiene, non-, partially, selectively or fully hydrogenated hydrocarbon resins based on C5, C5/C9 or C9 monomer streams, polyterpene resins based on α-pinene and/or β-pinene and/or δ-limonene, hydrogenated polymers of preferably pure C8 and C9 aromatics. Aforementioned tackifier resins may be used both alone and in a mixture. Both resins which are solid at room temperature and liquid resins may be employed. In order to ensure high ageing stability and UV stability, preference is given to hydrogenated resins having a degree of hydrogenation of at least 90%, preferably of at least 95%.

Preference is given, furthermore, to apolar resins having a DACP (diacetone alcohol cloud point) of more than 30° C. and an MMAP (mixed methylcylohexane aniline point) of greater than 50° C., more particularly having a DACP of more than 37° C. and an MMAP of more than 60° C. The DACP and the MMAP values each indicate the solubility in a particular solvent. The selection of these ranges produces a particularly high permeation barrier, particularly with respect to water vapour.

Further preference is given to resins having a softening temperature (ring/ball) of more than 95° C., in particular more than 100° C. This selection provides a particularly high permeation barrier, particularly with respect to oxygen.

If the aim is to achieve an increase in bond strength, on the other hand, resins having a softening temperature of below 95° C., more particularly below 90° C., are especially preferred.

Other additives which can typically be utilized include the following:
- plasticizers, such as, for example, plasticizer oils, or low molecular mass liquid polymers, such as low molecular mass polybutenes, for example
- primary antioxidants, such as, for example, sterically hindered phenols
- secondary antioxidants, such as, for example, phosphites or thioethers
- in-process stabilizers, such as C radical scavengers, for example
- light stabilizers, such as, for example, UV absorbers or sterically hindered amines
- processing assistants
- endblock reinforcer resins, and optionally further polymers of preferably elastomeric kind; elastomers which can be utilized accordingly include, among others, those based on pure hydrocarbons, for example unsaturated polydienes such as natural or synthetically produced polyisoprene or polybutadiene, chemically substantially saturated elastomers such as, for example, saturated ethylene-propylene copolymers, α-olefin copolymers, polyisobutylene, butyl rubber, ethylene-propylene rubber, and also chemically functionalized hydrocarbons such as, for example, polyolefins containing halogen, acrylate, allyl or vinyl ether.

In one embodiment of the present invention the hotmelt adhesive also comprises fillers; examples that may be mentioned, though without restriction, include oxides, hydroxides, carbonates, nitrides, halides, carbides or mixed oxide/hydroxide/halide compounds of aluminium, silicon, zirconium, titanium, tin, zinc or iron or of the alkali or alkaline earth metals. These fillers are, essentially, clay earths, examples being aluminium oxides, boehmite, bayerite, gibbsite, diaspore and the like. Especially suitable are phyllosilicates such as, for example, bentonite, montmorillonite, hydrotalcite, hectorite, kaolinite, boehmite, mica, vermiculite or mixtures thereof. It is also possible, however, to use carbon blacks or other modifications of carbon, such as carbon nanotubes.

As fillers of the hotmelt adhesive it is preferred to use nanoscale and/or transparent fillers. In the present context a filler is termed nanoscale if in at least one dimension it has a maximum extent of about 100 nm, preferably of about 10 nm. Particular preference is given to using those fillers which are transparent in the composition and have a platelet-shaped crystallite structure and a high aspect ratio with homogeneous distribution. The fillers with a platelet-like crystallite structure and aspect ratios well above 100 generally have a thickness of just a few nm, although the length and/or width of the crystallites may be up to several μm. Such filers are likewise referred as nanoparticles. The particulate form of the fillers with small dimensions, moreover, is particularly advantageous for a transparent version of the hotmelt adhesive.

Through the construction of labyrinth-like structures by means of the fillers described above in the adhesive matrix, the diffusion pathway for, for example, oxygen and water vapour is extended in such a way that their permeation through the layer of adhesive is lessened. For improved dispersibility of these fillers in the binder matrix, these fillers may be surface-modified with organic compounds. The use of such fillers per se is known for example, from US 2007/0135552 A1 and from WO 02/026908 A1.

In another advantageous embodiment of the present invention use is also made of fillers which are able to interact in a particular way with oxygen and/or water vapour. Water vapour or oxygen penetrating into the (opto)electronic arrangement is then chemically or physically bound by these fillers. These fillers are also referred to as getters, scavengers, desiccants or absorbers. Such fillers include by way of example, but without restriction, the following: oxdizable metals, halides, salts, silicates, oxides, hydroxides, sulphates, sulphites, carbonates of metals and transition metals, perchlorates and activated carbon, including its modifications. Examples are cobalt chloride, calcium chloride, calcium bromide, lithium chloride, zinc chloride, zinc bromide, silicon dioxide (silica gel), aluminium oxide (activated aluminium), calcium sulphate, copper sulphate, sodium dithionite, sodium carbonate, magnesium carbonate, titanium dioxide, bentonite, montmorillonite, diatomaceous earth, zeolites and oxides of alkali metals and alkaline earth metals, such as barium oxide, calcium oxide, iron oxide and magnesium oxide, or else carbon nanotubes. Additionally it is also possible to use organic absorbers, examples being polyolefin copolymers, polyamide copolymers, PET copolyesters or other absorbers based on hybrid polymers, which are used generally in combination with catalysts such as cobalt, for example. Further organic absorbers are, for instance, polyacrylic acid with a low degree of crosslinking, ascorbates, glucose, gallic acid or unsaturated fats and oils.

In order to maximize the activity of the fillers in terms of the barrier effect, their fraction should not be too small. The fraction is preferably at least 5%, more preferably at least 10% and very preferably at least 15% by weight. Typically as high as possible a fraction of fillers is employed, without excessively lowering the bond strengths of the hotmelt adhesive or adversely affecting other properties. In one embodiment, therefore, the fraction is not more than 95%, preferably not more than 70% and more preferably not more than 50% by weight.

Also advantageous is a very fine division and very high surface area on the part of the fillers. This allows a greater efficiency and a higher loading capacity, and is achieved in particular using nanoscale fillers.

In contrast to uncrosslinked hotmelt adhesives based on vinylaromatic block copolymers or else based on polyisobutylene, the adhesives of the invention, when bonded between two polyester films which additionally possess a barrier layer, do not exhibit bubbles after storage at 85° C. and 85% rh.

The hotmelt adhesive may be produced and processed from solution, from dispersion and from the melt. Preference is given to its production and processing from solution or from the melt. Production of the adhesive from solution is particularly preferred. In that case the constituents of the hotmelt adhesive are dissolved in a suitable solvent, for example toluene or mixtures of mineral spirit and acetone, and are applied to the carrier using techniques that are general knowledge. In the case of processing through the melt, these application techniques may be via a nozzle or a calender. In the case of techniques from solution, coatings with doctor blades, knives, rollers or nozzles are known, to name but a few.

In one preferred embodiment the volatile organic compounds (VOC) content of the hotmelt adhesive is not more than 50 μg of carbon per gram of composition, in particular not more than 10 μg C/g, measured in accordance with VDA 277. This has the advantage of better compatibility with the organic materials of the electronic construction and also with any functional layers present, such as a transparent layer of conductive metal oxide, such as indium-tin oxide, for example, or a similar layer of intrinsically conductive polymer.

The hotmelt adhesive either may be used for the full-area bonding of (opto)electronic arrangements, or else, after appropriate converting, diecuts, rolls or other shapes may be produced from the hotmelt adhesive or the hotmelt adhesive tape. Corresponding diecuts and shapes of the hotmelt adhesive/tape are then preferably adhered to the substrate to be bonded, in the form, for instance, of edge surrounds or boundary of an (opto)electronic arrangement. The choice of the form of the diecut or shape is not restricted and is selected as a function of the type of (opto)electronic arrangement. The possibility of flat lamination, in comparison to liquid adhesives, is advantageous for the barrier properties of the composition, through the increase in the permeation path length by lateral penetration of the permeants, since the permeation path length acts in inverse proportion to the permeation.

Where the hotmelt adhesive is provided in the form of a planar structure having a carrier, it is preferred for the thickness of the carrier to be preferably in the range from about 1 μm to about 350 μm, more preferably between about 4 μm and about 250 μm and more preferably between about 12 μm and about 150 μm. The optimum thickness depends on the (opto)electronic arrangement, on the end application and on the nature of the configuration of the hotmelt adhesive. Very thin carriers in the range from 1 to 12 μm are used with (opto)electronic constructions which are intended to have a low overall thickness, but this increases the cost and complexity of integration into the construction. Very thick carriers between 150 and 350 μm are employed when the focus is on an increased permeation barrier through the carrier and the stiffness of the construction; the protective effect is increased by the carrier, whereas the flexibility of the construction is reduced. The preferred range between 12 and 150 μm represents an optimum compromise encapsulation solution for the majority of (opto)electronic constructions.

Figure 2:
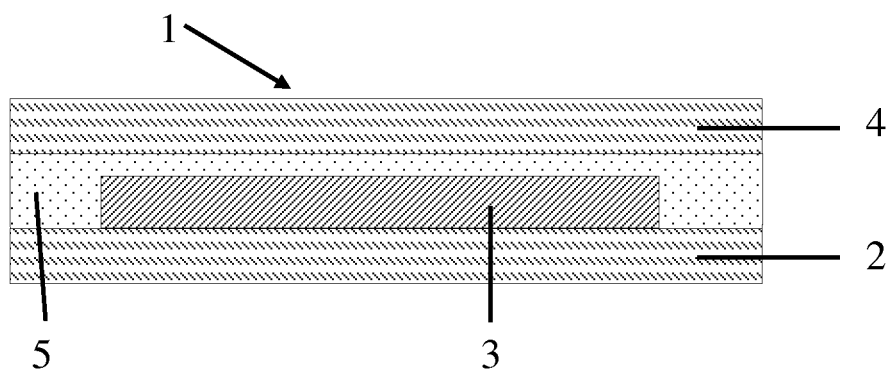
Figure 3:
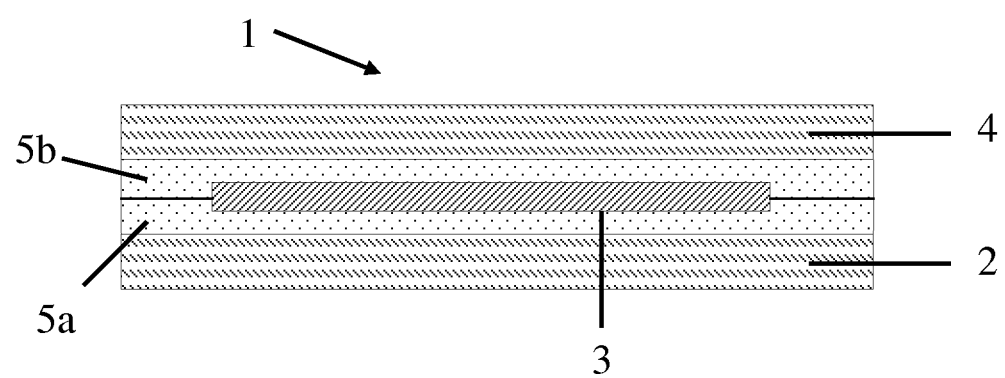

Further details, objectives, features and advantages of the present invention are elucidated in more detail below with reference to preferred exemplary embodiments. In the drawing FIG. 1 shows a first (opto)electronic arrangement in a diagrammatic representation, FIG. 2 shows a second (opto)electronic arrangement in a diagrammatic representation, FIG. 3 shows a third (opto)electronic arrangement in a diagrammatic representation.

FIG. 1 shows a first embodiment of an (opto)electronic arrangement 1. This arrangement 1 has a substrate 2 on which an electronic structure 3 is disposed. The substrate 2 itself is designed as a barrier for permeants and thus forms part of the encapsulation of the electronic structure 3. Above the electronic structure 3, in the present case also at a distance from it, is a further cover 4 designed as a barrier.

In order to encapsulate the electronic structure 3 to the side as well and at the same time to join the cover 4 to the electronic arrangement 1 in its remaining part, a hotmelt adhesive 5 is provided to run round on the substrate 2 adjacent to the electronic structure 3. The hotmelt adhesive 5 joins the cover 4 to the substrate 2. As a result of an appropriately thick embodiment, moreover, the hotmelt adhesive 5 allows the cover 4 to be distanced from the electronic structure 3.

The hotmelt adhesive 5 is an adhesive based on crosslinked vinylaromatic block copolymers as described above in general form and set out in detail below in exemplary embodiments. In the present case the hotmelt adhesive 5 not only takes on the function of joining the substrate 2 to the cover 4, but also, moreover, provides a barrier layer for permeants, in order thus to encapsulate the electronic structure 2 from the side as well with respect to permeants such as water vapour and oxygen.

In the present case, moreover, the hotmelt adhesive 5 is provided in the form of a diecut comprising a double-sided adhesive tape. A diecut of this kind permits particularly simple application.

FIG. 2 shows an alternative embodiment of an (opto)electronic arrangement 1. Shown, again, is an electronic structure 3 which is disposed on a substrate 2 and is encapsulated by the substrate 2 from below. Above and to the side of the electronic structure, the hotmelt adhesive 5 is now of full-area disposition. The electronic structure 3 is therefore encapsulated at these points by the hotmelt adhesive 5. A cover 4 is then applied to the hotmelt adhesive 5. This cover 4, in contrast to the previous embodiment, need not necessarily fulfil the high barrier requirements, since the barrier is provided by the hotmelt adhesive itself. The cover 4 may merely, for example, take on a mechanical protection function, or else may also be provided as a permeation barrier.

FIG. 3 shows a further alternative embodiment of an (opto)electronic arrangement 1. In contrast to the previous embodiments, there are now two hotmelt adhesives 5a, b, which in the present case are identical in form. The first hotmelt adhesive 5a is disposed over the full area of the substrate 2. The electronic structure 3 is then provided on the hotmelt adhesive 5a, and is fixed by the hotmelt adhesive 5a. The assembly comprising hotmelt adhesive 5a and electronic structure 3 is then covered over its full area with the other hotmelt adhesive 5b, with the result that the electronic structure 3 is encapsulated on all sides by the hotmelt adhesives 5a, b. Then, again, the cover 4 is provided above the hotmelt adhesive 5b.

In this embodiment, therefore, neither the substrate 2 nor the cover 4 need necessarily have barrier properties. Nevertheless, they may also be provided in order to restrict further the permeation of permeants to the electronic structure 3.

In relation to FIGS. 2, 3 in particular it is noted that in the present case these are diagrammatic representations. It is not apparent from the representations, in particular, that the hotmelt adhesive 5, here and preferably in each case, is applied with a homogenous layer thickness. At the transition to the electronic structure, therefore, there is not a sharp edge, as appears in the representation, but instead the transition is fluid and it is possible instead for small unfilled or gas-filled regions to remain. If desired, however, there may also be conformation to the substrate, particularly when application is carried out under vacuum. Moreover, the hotmelt adhesive is compressed to different extents locally, and so, as a result of flow processes, there may be a certain compensation of the difference in height at the edge structures. The dimensions shown are also not to scale, but instead serve only for greater ease of representation. The electronic structure in particular is itself usually of relatively flat design (often less than 1 μm thick).

In all of the exemplary embodiments shown, the hotmelt adhesive 5 is applied in the form of a hotmelt adhesive tape. This may in principle be a double-sided hotmelt adhesive tape with a carrier, or may be a heat-activable film, or may be an adhesive transfer tape. In the present case, a heat-activable film embodiment is selected.

The thickness of the hotmelt adhesive, present either as an adhesive transfer tape, as a heat-activable film or coated on a planar structure, is preferably between about 1 μm and about 150 μm, more preferably between about 5 μm and about 75 μm and with particular preference between about 12 μm and 50 μm. High layer thicknesses between 50 μm and 150 μm are employed when the aim is to achieve improved adhesion to the substrate and/or a damping effect within the (opto)electronic construction. A disadvantage here, however, is the increased permeation cross section. Low layer thicknesses between 1 μm and 12 μm reduce the permeation cross section, and hence the lateral permeation and the overall thickness of the (opto)electronic construction. However, there is a reduction in the adhesion on the substrate. In the particularly preferred thickness ranges, there is a good compromise between a low thickness composition and the consequent low permeation cross section, which reduces the permeation, and a sufficiently thick film of composition to produce a sufficiently adhering bond. The optimum thickness is a function of the (opto)electronic structure, the end application, the nature of the embodiment of the hotmelt adhesive, and, possibly, the planar substrate.

EXAMPLES

Unless indicated otherwise, all quantity figures in the examples below are weight percentages or parts by weight, based on the overall composition.

Test Methods
Bond Strength

The bond strength was determined as follows: the defined substrate used was a steel surface and a polyethylene terephthalate sheet (PET). The bondable planar element under investigation was cut to a width of 20 mm and a length of about 25 cm, provided with a handling section, and bonded at 100° C. in a heating press under a pressure of approximately 1 MPa. After cooling, the planar element, bonded beforehand, was removed at an angle of 180° at room temperature and at 300 mm/min from the substrate using a tensile testing instrument (from Zwick), and the force required to achieve this was measured. The measured value (in N/cm) resulted as the average from three individual measurements.

Shear Adhesion Failure Temperature (SAFT)

The SAFT was determined as follows: the defined substrate used was a polished steel surface. The bondable planar element under investigation was cut to a width of 10 mm and a length of about 5 cm, and was bonded to the selected substrate, having an area of 10×13 mm, at 100° C. in a heating press under a pressure of approximately 1 MPa. After cooling, the planar element, bonded beforehand, was loaded with 0.5 N at an angle of 180°, and a temperature ramp of 9° C./min was run. In the course of this ramp, a measurement was made of the temperature at which the sample travelled a slip path of 1 mm. The measured value (in ° C.) is given as the average value from two individual measurements.

Transmittance

The transmittance of the adhesive was determined via the VIS spectrum. The VIS spectrum was recorded on a Kontron UVIKON 923. The wavelength range of the measured spectrum encompasses all of the frequencies between 800 nm and 400 nm, with a resolution of 1 nm. For this purpose, the adhesive was applied to a PET carrier and, prior to measurement, an empty-channel measurement was carried out on the carrier as a reference, over the entire wavelength range. For the reporting of the result, the transmittance measurements in the stated range were average.

Permeation

The permeability for oxygen (OTR) and water vapour (WVTR) were determined in accordance with DIN 53380 part 3 and ASTM F-1249, respectively. For this purpose, the hotmelt adhesive was measured in a layer thickness of 50 μm without carrier material. For the oxygen permeability, measurement took place at 23° C. with a relative humidity of 50%. The water vapour permeability was determined at 37.5° C. with a relative humidity of 90%.

Flexural Test

To determine the flexibility, the adhesive in a layer thickness of 50 μm was sealed between two 23 μm PET carriers at 100° C. and tested to a bending radius of 1 mm with a 180° bend. The test is passed if there is no fracture or detachment of the layer.

Lifetime Test

As a measure of the lifetime of an (opto)electronic construction, a calcium test was employed. For this purpose, under a nitrogen atmosphere, a thin layer of calcium, measuring 20×20 mm$^2$, was deposited onto a glass plate. The thickness of the calcium layer is approximately 100 nm. The calcium layer is encapsulated using adhesive tape featuring the test adhesive and also a thin glass sheet (35 μm, Schott) as carrier material. The adhesive tape is applied with an all-round edge of 3 mm over the calcium mirror, by adhering the tape to the glass plate using a hot die having a surface temperature of 100° C. As a result of the impervious glass support of the adhesive tape, only the permeation through the hotmelt adhesive is determined.

The test is based on the reaction of calcium with water vapour and oxygen, as described, for example, by A. G. Erlat et. al. in "47th Annual Technical Conference Proceedings—Society of Vacuum Coaters", 2004, pages 654-659, and by M. E. Gross et al. in "46th Annual Technical Conference Proceedings—Society of Vacuum Coaters", 2003, pages 89-92. The light transmittance of the calcium layer is monitored, and increases as a result of its conversion into calcium hydroxide and calcium oxide. In the test set-up described, this takes place from the edge, and so there is a reduction in the visible area of the calcium mirror. The time taken for the area of the calcium mirror to halve is termed the lifetime. The measurement conditions selected are 60° C. and 90% relative humidity. The specimens were bonded in full-area form, without bubbles, with a layer thickness of the hotmelt adhesive of 15 μm.

Bubble Test

The adhesive film is bonded using a heating press at 120° C. to a PET barrier film which is provided with an inorganic barrier layer and has a thickness of 25 μm (WVTR=8×10$^{-2}$ g/m$^2$*d and OTR=6×10$^{-2}$ cm3/m$^2$*d*bar), as described above. The second side of the adhesive is then given a bubble-free bond with the same film, likewise under the hot press. After a peel increase time of 24 hours, the prepared specimen is stored at 85° C. and 85% rh. An investigation is made of whether and, if so, when bubbles are formed in the assembly, and also of the number of bubbles per cm² and their average size. The time taken for the first bubbles to appear is recorded.

Production of the Specimens

The hotmelt adhesives in Examples 1 to 3 were prepared from solution. For that purpose the individual constituents were dissolved in toluene (solids fraction 40%) and coated onto an untreated 23 μm PET film, and dried at 120° C. for 15 minutes, giving a layer of adhesive having a weight per unit area of 50 g/m². For the permeation test, specimens were produced in the same way, but coating took place not onto a PET film but instead onto a release paper with 1.5 g/m² siliconization, and so, following removal from the release paper, it was possible to carry out measurement on the pure hotmelt adhesive.

Example 1

| | | |
|---|---|---|
| 100 parts | Kraton FG 1924 | maleic anhydride-modified SEBS with 13% block polystyrene content, 36% diblock and 1% maleic acid, from Kraton |
| 25 parts | Escorez 5600 | hydrogenated HC resin (hydrocarbon resin) having a softening point of 100° C., from Exxon |
| 1 part | Aluminium acetylacetonate | |

Example 2

| | | |
|---|---|---|
| 50 parts | Kraton FG 1924 | maleic anhydride-modified SEBS with 13% block polystyrene content, 36% diblock and 1% maleic acid, from Kraton |
| 50 parts | Kraton FG 1901 | maleic anhydride-modified SEBS with 30% block polystyrene content, without diblock and with 1.7% maleic acid, from Kraton |
| 30 parts | Escorez 5615 | hydrogenated HC resin having a softening point of 115° C., from Exxon |
| 5 parts | Ondina 917 | White oil made up of parafinic and naphthenic fractions, from Shell |
| 1 part | Aluminium acetylacetonate | |

Comparative Example C3

| | | |
|---|---|---|
| 100 parts | Kraton G 1657 | SEBS with 13% block polystyrene content, from Kraton The SEBS contains about 36% diblock content |
| 20 parts | Escorez 5600 | Hydrogenated HC resin having a softening point of 100° C., from Exxon |
| 5 parts | Ondina 917 | White oil made up of parafinic and naphthenic fractions, from Shell |

Results:

For the technical assessment of the examples specified above, first of all the bond strength, SAFT test, tack and test for flexibility were carried out.

TABLE 1

| | Bond strength [N/cm] Steel/PET | SAFT [° C.] | Flexural test |
|---|---|---|---|
| Example 1 | 4.2/3.7 | 180 | passed |
| Example 2 | 4.7/4.3 | 180 | passed |
| C3 | 3.6/3.3 | 126 | passed |

As is apparent, sufficient bond strengths were achieved on all substrates in all examples, and, in the case of both Examples 1 and 2, excellent resistances were achieved at elevated temperatures.

The results of the permeation and transmittance measurements are given in Table 2.

TABLE 2

| | WVTR g/(m² * day) | OTR g/m² * day * bar) | Transmittance [%] |
|---|---|---|---|
| Example 1 | 25 | 5550 | 90 |
| Example 2 | 23 | 5020 | 89 |
| C3 | 36 | 9500 | 91 |

As is apparent, the barrier action of the hotmelt adhesives from the first two examples is in fact somewhat better than in the case of Comparative Example C3, and the transmittance in the visible range of light is similar. The former is surprising to a person skilled in the art, since the functionalization raises the polarity of the compositions and hence at least the WVTR ought to be higher than that of the more apolar comparative adhesive.

Results of the Lifetime Test:

TABLE 3

| | Lifetime [h] | Bubble test [time in h] |
|---|---|---|
| Example 1 | 420 | no bubbles after 14 days |
| Example 2 | 380 | no bubbles after 14 days |
| C3 | 120 | first bubbles after 2 hours |

The lifetime tests show similar results to those of non-crosslinked vinylaromatic block copolymer compositions. In the bubble test, a distinct improvement is apparent; the bubbles in the comparative example were on average around 410 μm in diameter after 20 hours, the number being approximately 180 bubbles per cm².

The invention claimed is:

1. A method of encapsulating an electronic arrangement with respect to permeants, comprising encapsulating an electronic arrangement by completely enclosing the arrangement with an at least partly crosslinked hotmelt adhesive based on acid-modified or acid-anhydride modified vinylaromatic block copolymers.

2. The method according to claim 1, wherein the hotmelt adhesive is in the form of an adhesive tape.

3. The method according to claim 2, wherein the layer thickness of the hotmelt adhesive in the adhesive tape is between 1 μm to 150 μm.

4. The method according to claim 1, wherein the hotmelt adhesive is crosslinked using amines or epoxy resins.

5. The method according to claim 4, wherein the modified vinylaromatic block copolymers are crosslinked by amines.

6. The method according to claim 4, wherein the modified vinylaromatic block copolymers are crosslinked by epoxy resins.

7. The method according to claim 1, wherein the hotmelt adhesive is crosslinked using metal chelates.

8. The method according to claim 7, wherein the metal chelates may be represented by the following formula:

$$(R_1O)_nM(XR_2Y)_m,$$

where
- M is a metal from main group 2, 3, 4 or 5 or a transition metal;
- $R_1$ is an alkyl or aryl group such as methyl, ethyl, butyl, isopropyl or benzyl;
- n is zero or a larger integer,
- X and Y are oxygen or nitrogen, and may each also be joined to $R^2$ by a double bond;
- $R_2$ is an alkylene group which joins X and Y and which may be branched, or else may comprise oxygen or other heteroatoms in the chain;

m is an integer, but is at least 1.

9. The method according to claim 8, wherein the chelate is an acetylacetonate.

10. The method according to claim 9, wherein the chelate is aluminium acetylacetonate.

11. The method according to claim 1, wherein the hotmelt adhesive comprises polymer blocks formed from vinylaromatics and in that the hotmelt adhesive comprises polymer blocks formed by polymerization of 1,3 dienes.

12. The method according to claim 11, wherein the block copolymers have a polyvinylaromatic fraction of 10% to 35% by weight.

13. The method according to claim 11, wherein the hotmelt adhesive has a vinylaromatic block copolymer fraction of at least 50% by weight.

14. The method according to claim 1, wherein the hotmelt adhesive comprises a resin or a resin mixture.

15. The method according to claim 1, wherein the hotmelt adhesive comprises one or more additives selected from the group consisting of: plasticizers, primary antioxidants, secondary antioxidants, in-process stabilizers, light stabilizers, processing assistants, endblock reinforcer resins, and polymers.

16. The method according to claim 1, wherein the hotmelt adhesive comprises one or more fillers.

17. The method according to claim 16, wherein the fillers are of nanoscale form in at least one dimension.

18. The method according to claim 1, wherein the hotmelt adhesive is transparent in form, wherein the hotmelt adhesive has an average transmittance of at least 75% in the wavelength range from 400 nm to 800 nm.

19. The method according to claim 1, wherein the hotmelt adhesive is of UV-blocking design in the wavelength range from 320 nm to 400 nm and UV-blocking denoting an average transmittance of not more than 20%.

20. The method according to claim 1, wherein the hotmelt adhesive has a water vapor transmission rate of less than 80 $g/m^2 \cdot d$ and/or in that the hotmelt adhesive has an oxygen transmission rate of less than 8000 $g/m^2 \cdot d \cdot bar$.

21. The method according to claim 20, wherein the hotmelt adhesive is designed as an adhesive tape having a carrier having a water vapor transmission rate of not more than $10^{-2}$ $g/m^2 \cdot d$.

* * * * *